United States Patent [19]
Chow et al.

[11] Patent Number: 5,949,064
[45] Date of Patent: Sep. 7, 1999

[54] OPSISTOR IMAGE PROCESSOR WITH A REFERENCE DETECTOR AND A REFERENCE IMAGE

[75] Inventors: Alan Y. Chow, 191 Palamino Pl., Wheaton, Ill. 60187; Vincent Y. Chow, Hanover Park, Ill.

[73] Assignee: Alan Y. Chow, Wheaton, Ill.

[21] Appl. No.: 08/977,853

[22] Filed: Nov. 25, 1997

Related U.S. Application Data

[63] Continuation-in-part of application No. 08/755,729, Nov. 25, 1996, Pat. No. 5,837,995.

[51] Int. Cl.⁶ .................................................. H01J 40/14
[52] U.S. Cl. .............................. 250/214 LS; 250/208.1; 348/222
[58] Field of Search ........................ 250/214 LS, 208.1, 250/214.1, 551; 348/222, 294, 311

[56] References Cited

U.S. PATENT DOCUMENTS

| | | |
|---|---|---|
| 4,001,867 | 1/1977 | Kravitz et al. . |
| 4,873,448 | 10/1989 | Shirai ........................................ 250/551 |
| 5,130,528 | 7/1992 | Phillips, Jr. ......................... 250/214 LS |
| 5,130,776 | 7/1992 | Popovic et al. . |
| 5,223,728 | 6/1993 | Gempe ..................................... 257/443 |
| 5,256,882 | 10/1993 | Miyasaka ................................. 250/551 |
| 5,338,991 | 8/1994 | Lu . |
| 5,351,309 | 9/1994 | Lee et al. .................................... 382/22 |
| 5,491,349 | 2/1996 | Komoto et al. ............................. 257/88 |
| 5,648,655 | 7/1997 | Rostoker ............................... 250/208.1 |
| 5,711,201 | 1/1998 | Lin et al. ............................. 250/214 R |

FOREIGN PATENT DOCUMENTS

| | | |
|---|---|---|
| 0084621 | 11/1982 | European Pat. Off. . |
| 0501904 | 2/1992 | European Pat. Off. . |
| 9639221 | 12/1996 | European Pat. Off. . |

OTHER PUBLICATIONS

The Vertical Integration of Crystalline NMOS and Amorphous Orientational Edge Detector, Heng–Chih Lin, Wen–Jyh Sah, and Si–Chen Lee (Dec. 12, 1992) vol. 39, No. 12, pp. 2810–2812.

*Primary Examiner*—Que T. Le
*Attorney, Agent, or Firm*—Mayer, Brown & Platt

[57] ABSTRACT

An image processing system for capturing and compressing images into a digital format is disclosed. The system has an array of imaging pixel elements which consist of two photodiode detectors (Opsistor). One photodiode detector is a capture detector while the other detector is a reference detector. The capture detector has an anode electrically coupled to the cathode of the reference detector. The cathode of the capture detector is electrically coupled to the anode of the reference detector. An image may be compared to a reference image detected by the reference detector. Different levels of light between the captured image and the reference image change the electrical output of the opsistor. Image compression is facilitated since only pixel elements which change from frame to frame need be stored. Additionally, a processing and compression circuit may use column and row scans to eliminate unchanged pixels and store only pixels with different light levels between images.

41 Claims, 6 Drawing Sheets

OPSISTOR IMAGE PROCESSOR WITH A REFERENCE DETECTOR AND A REFERENCE IMAGE

RELATED APPLICATION

This application is a continuation in part to application Ser. No. 08/755,729, now U.S. Pat. No. 5,837,995, titled "Wavelength Controllable Voltage Phase Photodiode Optoelectronic Switch (Opsistor)," filed on Nov. 25, 1996, to the same inventors.

FIELD OF INVENTION

This invention relates to an image processor system. More particularly, the invention relates to an image processor which incorporates optical switching utilizing opsistor technology to capture and compress digital images.

BACKGROUND OF INVENTION

Still images were first captured and stored through the use of film cameras. Later developments allowed capture of moving images by taking a sequence of images (frames) and showing them in rapid secession. The reproduction of moving images was enhanced by the use of video technology utilizing magnetic tapes. However, analog formats such as film and magnetic tapes are inherently imperfect since flaws are added in the reproduction of such media.

More recently, both still images and moving (video) images have been stored in a digital format, allowing flawless reproduction of such images. Digitization of images involves segmenting an image into discrete elements. In an example of existing art, the light levels corresponding to each of the discrete elements (pixels) of an image are sensed by a charge coupled device (CCD) producing a numerical value. An image may thus be stored as an array of elements which each have a digital value of the light level for that particular element in the image. Detailed images may be captured and stored by imaging arrays with relatively large numbers of pixels. Additionally, the greater the differential in light levels per pixel, the wider and more detailed the range of colors or grays that may be captured. With a sufficiently high number of pixels and a sufficient level of colors, digital images become indistinguishable from their analog film counterparts.

Detailed digital images, however, require large amounts of storage since they have a large number of pixels. Additionally, each pixel must be capable of storing a large range of numerical values further increasing memory demands. If digital video is considered, even more memory and processing speed are required since digital video systems typically capture or display 30–70 separate images (frames) per second. For example, at 30 frames per second, a modest VGA grade video monitor of 640×480 pixel resolution with 24 bits of color requires computing power to process over 27 MBytes of raw data per second. At 1024× 768 pixel resolution, the data processing requirements escalate to over 70 Mbytes per second! Current solutions in machine vision and digital video solve the problems through brute computer horsepower and parallel processing techniques with only equivocal success.

The two formidable hurdles that prevent high speed processing of digital video are the retrieval of the data from the sensor and the completion of image processing before retrieval of the next frame. Frame rates, therefore, suffer by the square of the linear frame size as more details and higher resolutions are involved. The higher the pixel count, the greater the problems of retrieval and processing. With such large demands for memory and processing power, it is extremely difficult to produce a cost effective video imaging system without help from image compression. Thus, image compression is a critical aspect of digital video, capture, storage and transmission.

Compression reduces the amount of processing and memory necessary for digital video, which subsequently reduces the information bandwidth required to transmit such digital video signals. Image compression relies on the fact that many pixel elements within a given image have identical numerical values and do not have to be stored separately. In digital video, compression also relies on the fact that the image in a given frame does not change significantly from images in previous frames. To maximize compression effectiveness, only differences between frames are stored whenever possible.

Current techniques for image compression involve software techniques which utilize complex algorithms to find frame differences, reducing the amount of information processed to increase imaging speed. For example, compression schemes today are built on powerful MPEG engines designed specifically for moving pictures. Popular compression algorithms are based on cosine transforms and/or fractal mathematics. Such algorithms may be lossy, in which case data from the original images are lost by approximation. Such "lossy" compression increases speed but sacrifices image accuracy and thus is undesirable for high quality applications such as digital video. Other so called "loss-less" techniques may retain original image detail but sacrifice the frame rate speed necessary for many video applications.

All such software techniques are limited by the physical speed and requirements of the hardware components. To understand the demands placed on these components utilizing present techniques, even if just one pixel changes within an image, a conventional digital video processor must perform the time consuming steps of retrieving a full frame and digitally processing it. Faster hardware components aid in image capture and image processing but the cost of such existing hardware is high and its capabilities are limited.

A new hardware component, that enables substantially faster image capture and processing is the opsistor, which possesses significant advantages for imaging applications compared to a single photodiode in the unbiased or photovoltaic mode. Previously, imaging pixels using a photovoltaic principle were typically based on single photodiode, phototransistor, photodarlington, and the like. These are photosensitive devices with "on", "off" and linear response states. For high speed applications which include machine vision, the inherent speed of such devices was limited by the rate at which they could switch their currents "on" and "off," the limiting factor often being the passive return-to-ground period. Also for an "on" potential to be recognized, the photocurrents had to be at a sufficient amplitude to stand out above background noise. However, the higher the signal current that was needed to generate this recognition, the longer it would take for the photonic device to generate that current level, and the even longer period before the current decay would return to the ground level. These characteristics of previous optoelectronic sensors resulted in relatively slow response speeds in the photovoltaic mode of usually less than 1 MHZ for a standard photodiode, and even slower speeds for more complicated devices such as phototransistors.

Although photovoltaic diodes may be designed to respond to faster frequencies by using special circuitry, the additional components of such circuitry increase the complexity and cost of such devices. Further, the implementation of active circuitry within an imaging pixel decreases the light sensitive area and compromises low light performance.

Thus, a need exists for a rapid image compression circuit that uses a simple and a fast photovoltaic sensor such as a real time spatial optical differentiator type switch, like the opsistor. There is a further need for a simple and efficient image compression system which operates without losing image quality. There also is a need for a simple and efficient image processing circuit which may be integrated with a compression circuit by outputting only differences between frames. There is also a need for an image processing circuit which allows more rapid location of different pixels between frames.

SUMMARY OF THE INVENTION

These needs may be addressed by the present invention which is embodied in an image processing system for capturing and compressing a series of images from an image source. The system includes an image array having at least one pixel element. Each pixel element has a capture photo detector having an anode and a cathode. The capture detector is exposed to the image source. Each pixel element also has a reference photo detector having an anode and a cathode. The anode of the reference detector is electrically coupled to the cathode of the capture optical detector. The cathode of the reference detector is electrically coupled to the anode of the capture detector. A light emitter array having at least one light emitter corresponding to each pixel element is provided. The light emitter emits light on the reference detector. A processing circuit is electrically coupled to each pixel element and each light emitter. The processing circuit projects a reference image from the light emitter on the reference detector and compares the reference image with the image sensed by the capture detector.

The invention is further embodied in a method of capturing and compressing a digital image from an image area using an array of optical pixel elements producing a capture voltage level indicative of a captured image. The capture voltage signal of each pixel element is compared with a reference voltage signal from the light level of a reference image. The difference value between the capture voltage signal and the reference voltage signal is then determined. The pixel elements where no change has occurred between the reference image and the captured image are then determined. Finally, the difference values associated with the pixel elements are stored.

It is to be understood that both the foregoing general description and the following detailed description are not limiting but are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

DESCRIPTION OF THE PREFERRED EMBODIMENT

Figure 1:
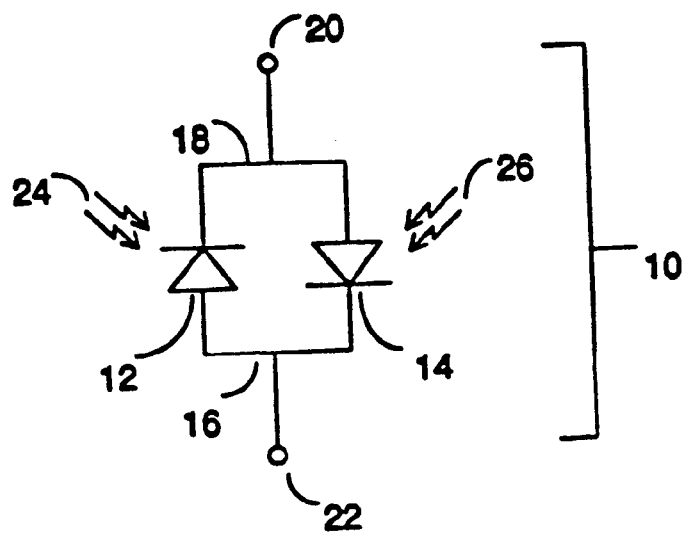
FIG. 1 is a schematic diagram of the basic opsistor according to the first preferred embodiment of the present invention.

While the present invention is capable of embodiment in various forms, there is shown in the drawings and will hereinafter be described a presently preferred embodiment with the understanding that the present disclosure is to be considered as an exemplification of the invention, and is not intended to limit the invention to the specific embodiment illustrated.

The present invention is directed toward an image processing system utilizing an opsistor (10) shown in FIG. 1 which comprises two PIN photodiodes, the first photodiode (12) and the second photodiode (14), electrically connected in an inverse parallel manner such that the anode of the first photodiode (12) is electrically connected to the cathode of the second photodiode (14) via a first common conductor (16), and the cathode of the first photodiode (12) is connected to the anode of the second photodiode (14) via a second common conductor (18). The voltage phase developed by the opsistor (10) is measured from the first output terminal (20) and the second output terminal (22). A first transmitter signal light source (24) to the first photodiode (12) is represented by the arrows (24). A second transmitter signal light source (26) to the second photodiode (14) is represented by the arrows (26). The voltage-phase developed at the output terminals (20,22) is determined by which of the two photodiodes (12,14) produces a higher voltage which is dependent on the relative intensity of illumination they receive from the transmitter signal light sources (24, 26). For example if the first photodiode (12) produces a higher voltage than the second photodiode (14), then the voltage phase measured from the first output terminal (20) will be negative and the voltage-phase from the second output terminal (22) will be positive. On the other hand, if the voltage from the second photodiode (14) is greater than the voltage from the first photodiode (12), then the voltage-phase measured from the first output terminal (20) will be positive and the voltage-phase measured from the second output terminal (22) will be negative. Thus if the two photodiodes (12,14) are similar or identical as possible, the voltage-phase from the output terminals (20,22) is controlled by relative intensity of illumination of the two photodiodes, i.e. changes in the relative illumination from transmitter signal light sources (24,26) to the two photodiodes (12,14).

Figure 2:
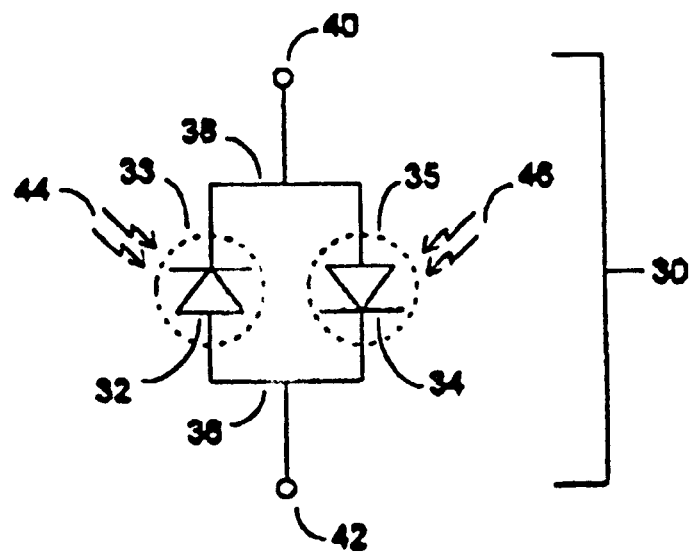
FIG. 2 is a schematic diagram of the OPS-F according to the second preferred embodiment of the present invention.

One sample application of the opsistor is a bandwidth-filtered opsistor ("the OPS-F") (30) shown in FIG. 2. The OPS-F (30) comprises two PIN photodiodes (32,34), the first photodiode (32) filtered with the first bandwidth-portion filter (33), and the second photodiode (34) filter with the second bandwidth-portion filter (35), electrically connected in an inverse parallel manner such that the anode of the first photodiode (32) is electrically connected to the cathode of the second photodiode (34) via a first common conductor (36), and the cathode of the first photodiode (32) is connected to the anode of the second photodiode (34) via a second common conductor (38). The first bandwidth-portion filter (33) passes a different bandwidth of transmitter signal light than the second wavelength-portion filter (35). The voltage-phase developed by the OPS-F (30) is measured from the first output terminal (40) and the second output terminal (42). The first bandwidth-portion signal light source ("WPSLS-1") (44) to the first photodiode (32) is represented by the arrows (44). The second bandwidth-portion signal light source ("WPSLS-2")(46) to the second photodiode (34) is represented by the arrows (46). Because each wavelength-portion filtered photodiode (32, 34) responds only to its own specific bandwidth of light, WPSLS-1 (44) for photodiode (32) and WPSLS-2 (46) for photodiode (34) can be provided from a distant location without cross-talk interference. The term "light" is not restricted to visible light, but also include wavelengths from the far ultraviolet to the far infrared.

The voltage-phase developed at the output terminals (40,42) is determined by which of the two photodiodes (32,34) produces a higher voltage which in turn is dependent on the relative illumination they receive from the transmitter signal light sources, WPSLS-1 (44) and WPSLS-2 (46). For example in FIG. 2, if the first photodiode (32) receives a greater illumination from WPSLS-1 (44) and thus produces a higher voltage than the second photodiode (34) being illuminated by WPSLS-2 (46), then the voltage-phase measured from the first output terminal (40) will be negative and the voltage-phase from the second output terminal (42) will be positive. On the other hand, if the second photodiode (34) receives a greater illumination from WPSLS-2 (46) and thus produces a higher voltage than the first photodiode (32) receiving illumination from WPSLS-1 (44), then the voltage-phase measured from the first output terminal (40) will be positive and the voltage-phase measured from the second output terminal (42) will be negative. Thus if the two photodiodes (32,34) are similar or identical, the voltage-phase from the output terminals (40,42) is controlled by relative illumination and changes in the relative illumination of WPSLS-1 (44) and WPSLS-2(46) to the two photodiodes (32,34).

Figure 3:
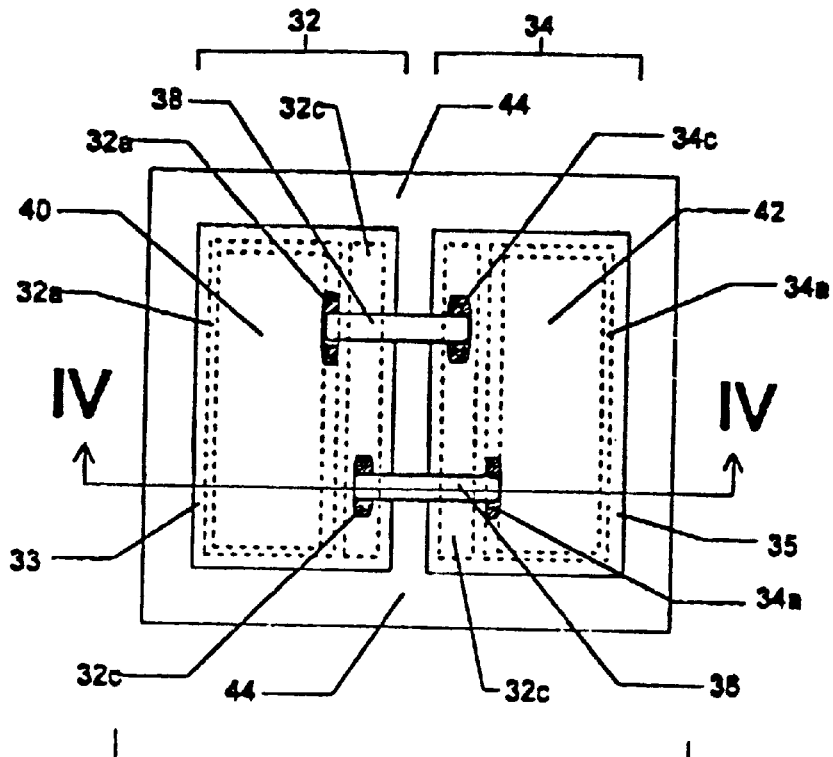
FIG. 3 is a plan view of the OPS-F constructed as a monolithic integrated circuit according to the second preferred embodiment of the present invention.
Figure 4:
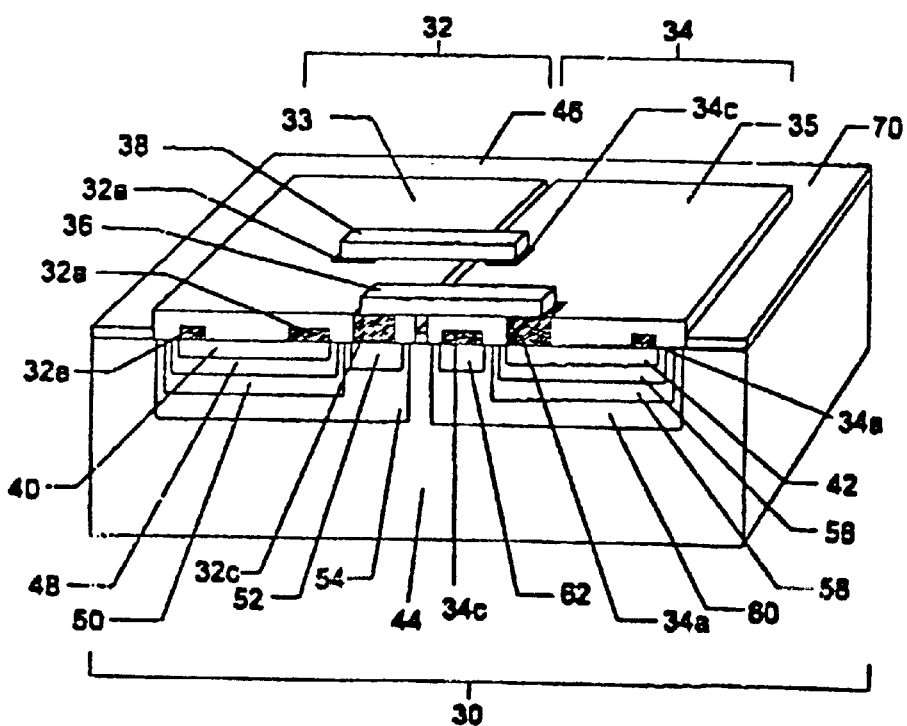
FIG. 4 is a three-dimensional section view of the OPS-F constructed as a monolithic integrated circuit according to the second preferred embodiment of the present invention taken along the plane of line IV—IV of FIG. 3.

Preferably, as shown in FIGS. 3–4, the OPS-F device (30), is constructed as a monolithic integrated circuit. The OPS-F (30) consists of two PIN photodiodes (32,34), the first photodiode (32) filtered with the first bandwidth-portion filter (33), and the second photodiode (34) filter with the second bandwidth-portion filter (35), electrically connected in an inverse parallel manner such that the cathode (32c) of the first photodiode (32) is electrically connected to the anode (34a) of the second photodiode (34) via a first common conductor (36), and the anode (32a) of the first photodiode (32) is connected to the cathode (34c) of the second photodiode (34) via a second common conductor (38). The first bandwidth-portion filter (33) passes a different bandwidth of stimulating light than the second bandwidth-portion filter (35). The voltage-phase developed by the OPS-F (30) is measured from the first common conductor (36) and the second common conductor (38) which are also the output terminals. The voltage-phase developed at the common conductors (36,38) is determined by which of the two photodiodes (32,34) produces a higher voltage which is dependent on the relative illumination which they receive from their respective signal light sources.

For example if the illumination of the entire OPS-F (30) contains a greater proportion of bandwidths that can stimulate the first photodiode (32) than can stimulate the second photodiode (34), then a higher voltage will be developed by the first photodiode (32) than the second photodiode (34), and the voltage-phase measured from the first common conductor (36) will be negative and the voltage-phase measured from the second common conductor (38) will be positive. On the other hand, if the illumination to the entire OPS-F (30) contains a greater proportion of bandwidths that can stimulate the second photodiode (34) than can stimulate the first photodiode (32), then a higher voltage will be developed by the second photodiode (34) than the first photodiode (32), and the voltage-phase measured from the first common conductor (36) will be positive and the voltage-phase measured from the second common conductor (38) will be negative.

In an example of the OPS-F (30) shown in FIGS. 3–4, the P+ surface (40) of the first photodiode (32) has its anode (32a) deposited around the entire edge of the P+ region (40), and the cathode (32c) of the first photodiode (32) is deposited completely over a large area of the N+ region (52) under the cathode (32c). Similarly in the preferred embodiment of the OPS-F (30) shown in FIG. 3, the P+ surface (42) of the second photodiode (34) has its anode (34a) deposited around the entire edge of its P+ region (42), and the cathode (34c) of the second photodiode (34) is deposited completely over a large area of the N+ region (62) under the cathode (34c). The starting P-type silicon substrate (44) is shown surrounding the two photodiodes (32, 34). Although, the starting monolithic silicon substrate (44) for the illustrated preferred embodiment of the OPS-F device (30) of the present invention is undoped silicon (44), those skilled in the art will recognize that P-type or N-type silicon may also be use as a starting monolithic silicon substrate by altering the fabrication of the OPS-F's photodiodes.

As illustrated in FIG. 4, the construction of the OPS-F (30) follows standard semiconductor fabrication processes. PIN photodiodes (32,34) each with a distinct intrinsic layer (50,58) are used in this embodiment because of their wider depletion region and higher switching speeds. A first heavily doped N-region (54) and a second heavily doped N-region (60) are fabricated in close proximity to each other in the starting undoped substrate (44). A first N+ region (52), and a second N+ region (62) are then fabricated in the first N-region (54) and the second N-region (60) respectively. A first heavily doped P-region (48) and a second heavily doped P-region (56) are then fabricated in the first N-region (54) and second N-region (60) respectively. A first intrinsic layer (50) then forms at the junction of the P-region (48) and the N-region (54). A second intrinsic layer (58) then forms at the junction of the P-region (56) and the N-region (60). A first P+ region (40) is then fabricated in the first P-region (48), and a second P+-region (42) is then fabricated in the second P-region (56). A first metallic anode (32a) is deposited on the first P+ region (40) on its perimeter to permit a large area of electrical contact and a second metallic anode (34a) is deposited on the second P+ region (42) on its perimeter to permit a large area of electrical contact. A first metallic cathode (32c) is deposited on the entirety of the first N+ region (52) to permit a large area of electrical contact. A second metallic cathode (34c) is deposited on the entirety of the second N+ region (62) to permit a large area of electrical contact. The first wavelength-portion filter (33), which in the preferred embodiment is a multilayer dielectric layer, is deposited on the first photodiode (32). The second wavelength-portion filter (35), which in the preferred embodiment is a multilayer dielectric filter, is deposited on the second photodiode (34).

Filter layers (33,35) each pass a different bandwidth of light within the spectrum from 450 nm to 1150 nm, the spectral response of silicon photodiodes. In the preferred embodiment for example, the first filter layer (33) has a bandwidth pass from 600 nm to 850 nm, and the second filter layer (35) has a bandwidth pass from 850 nm to 1100 nm. Those skilled in the art however will recognize that other bandwidths, both greater and smaller, are also useful.

A silicon dioxide insulating layer (70) is fabricated on the areas of the OPS-F (30) not covered by the filter layers (33,35). Openings are etched in filter layers (33,35) to exposed the anodes (32a, 34a) and the cathodes (32c, 34c). A first common conductor (36) is then deposited to connect the first cathode (32c) to the second anode (34a), and a second common conductor (38) is deposited to connect the first anode (32a) to the second cathode (34c). The common conductors (36,38) also serve as the output terminals (42,40) illustrated in FIG. 2.

Figure 5:
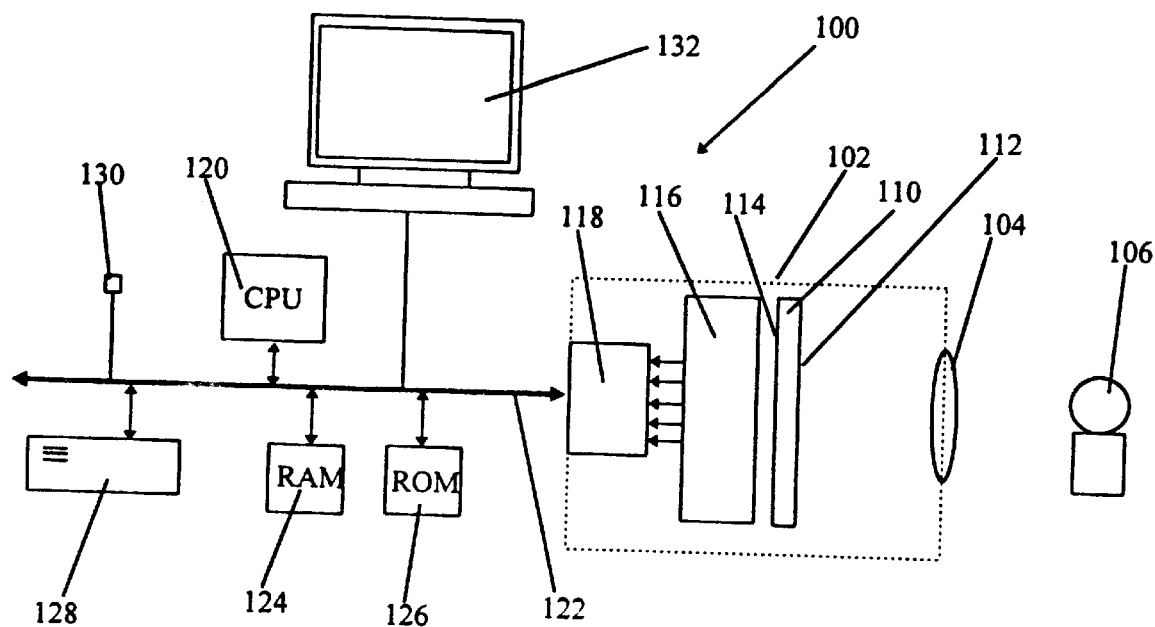
FIG. 5 is a block diagram of an image processing system according to the present invention.

The present invention incorporates the opsistor matched sensor in a solid state image processing system 100 for capturing and compressing a series of digital images as shown in FIG. 5. The system 100 has a digital video camera 102 for capturing and processing high speed video images. The camera 102 has a lens 104 which focuses and captures light from an image source such as image 106 in a conventional manner. The lens 104 allows the image 106 to be transmitted to a solid state image array detector 110. The array detector 110 has a front focal plane 112 and a rear focal plane 114. The front and rear focal planes 112 and 114 of the image array detector 110 comprise a grid of pixel elements which serve to capture the light levels from discrete points of image 106. In the preferred embodiment there are 480× 640 pixels in the array detector 110. Of course other array sizes may be used. The individual pixel elements are opsistor detector circuits whose operation will be explained below. The array detector 110 captures the image 106 on the front focal plane 112.

The array detector 110 is coupled to the input of a processing circuit 116 which processes and compresses the raw image data from the array detector 110. The processing circuit 116 also projects a stored reference image on the rear focal plane 114 of the array detector 110 and compares the reference image with the image on the front focal plane 112 as will be explained below. The output of the processing circuit 116 is coupled to an analog to digital converter 118. The analog to digital converter 118 is a standard circuit and may include conversion circuits for each pixel in the array detector 110 or may be used in a multi-plexing arrangement with the appropriate circuits. In this embodiment, the analog to digital converter 118 produces a single bit digital output (black and white) for each pixel.

The analog to digital converter 118 and the processing circuit 116 are coupled to a processor 120 via a data bus 122. The output from the camera 102 is a digitally compressed file which is transmitted and stored frame by frame by the processor 120. The processor 120 may be an appropriate conventional microprocessor with sufficient capacity to run compression routines. The processor 120 takes the image data from the analog to digital converter 118 and the processing circuit 116 and runs compression routines or algorithms for capture, storage or playback of the images. The processor 120 is coupled to temporary memory, such as RAM 124, which stores temporary image data and the compression routines or algorithm data. A permanent memory 126, which may be ROM, EPROM, EEPROM, etc., serves to store program instructions for the processor 120. A large permanent storage device, such as a hard drive 128, is coupled to the processor 120 for storage of the compressed video image data. The image data may also be sent to an output port 130 which may be any communication bus such as a bidirectional parallel port. The output port 130 may also be used for output of the image as a real time digital video feed. The image may also be displayed on a monitor 132 which may be a CRT or LCD screen.

The camera 102 in the preferred embodiment is a black and white camera. However, it is to be understood that the principles of the present invention may be employed in a grayscale or color camera. With a grayscale camera, the light levels detected by each element of the detector array 110 are converted to a scaled digital value by the analog to digital converter 118. For example, an 8 bit analog to digital converter will yield 256 gray levels.

With a color camera, three detector arrays are used similar to a three charge coupled display (CCD) analog camera. The color camera has a red, green and blue waveband filter for three different focal array detectors, each similar to the array detector 110. Each focal array detector contributes a color value for an individual pixel to produce a composite image. Thus, each pixel element of the composite image has a red, green and blue value.

For lower resolution images, RGB opsistor patterns can be used similar to single chip color CCDs. Three opsistor pixels are clustered together to form an RGB tri-pixel similar to those of a standard color camera. These pixels are each filtered to respond to the three primary color wavebands of red, green and blue. The final video output signal is essentially three separate opsistor single color outputs. This is similar to the RGB video output of a standard video camera. Other color schemes such as CMKY may also be used using different filters. Additionally, light from images in non-visible wavebands such as infra red (IR) and ultra violet (UV) may be detected using appropriate filters and detectors.

Figure 6:
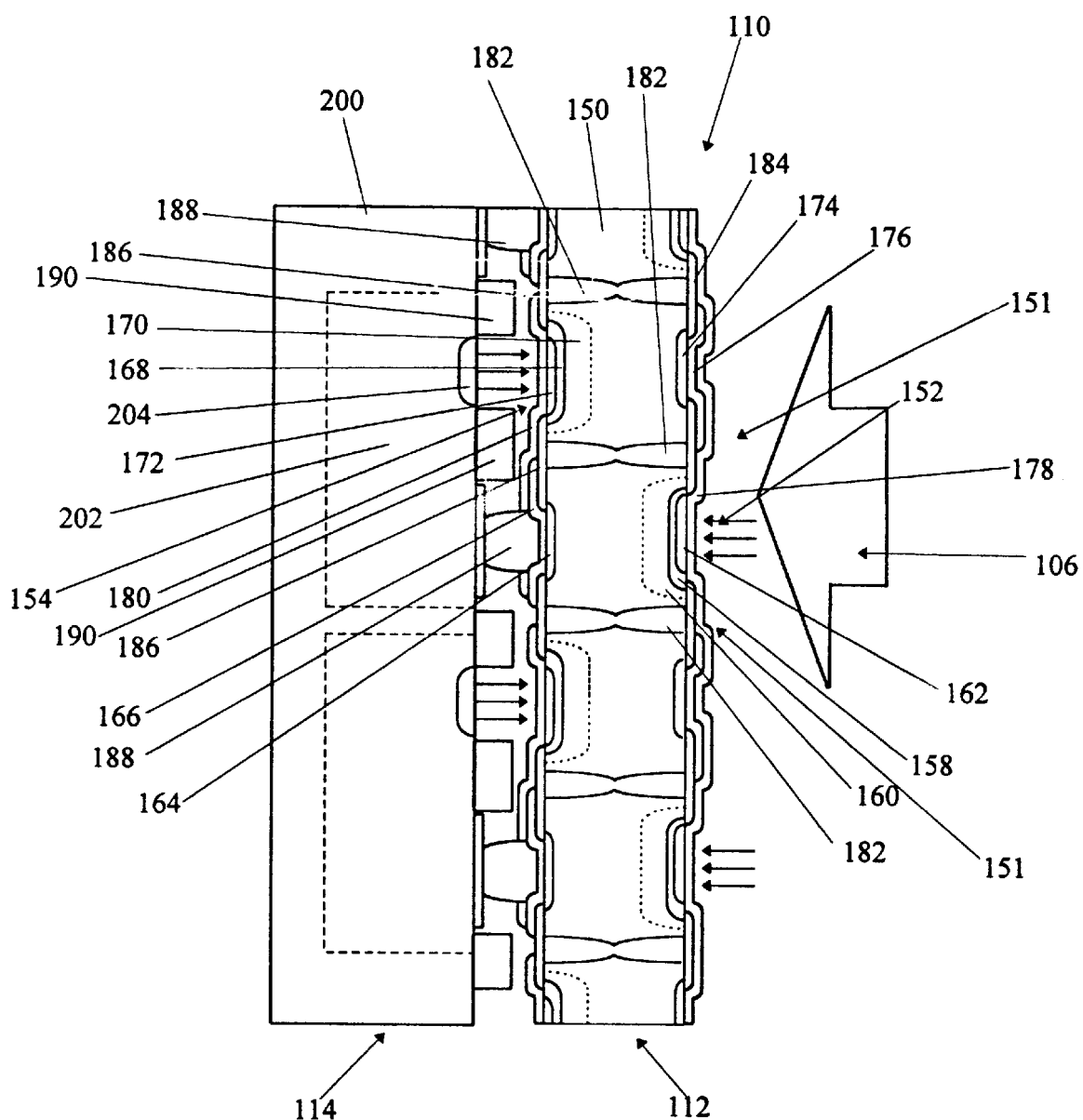
FIG. 6 is a cross section of an array detector substrate and processing circuity according to a first embodiment of the present invention.

As will be explained, the use of opsistor pixel elements in the array detector 110 allows for extremely fast and efficient image capture, compression and storage by the processor 120. In the preferred embodiment, the entire opsistor focal plane array detector 110 is fabricated on a single chip using thin silicon substrate technology. However, other types of solid state fabrication may be used for the single chip. FIG. 6 shows the cross section of some of the pixel elements of the imaging array detector 110 and an ASIC 200 which includes the processing circuit 116 and the analog to digital converter 118 from FIG. 5.

The imaging array detector 110 is formed from a silicon N-type substrate 150 which is processed on both sides to produce arrays of light sensitive opsistor PiN detectors 151 (pixel elements). Each opsistor detector 151 (pixel element) has a front capture photo detector such as a front capture photo diode 152 and a reference photo detector such as rear reference photo diode 154. For purposes of explanation, the front capture diode 152 is only one of numerous diodes located in the front focal plane 112 of the array detector 110. Correspondingly, rear reference diode 154 is one of numerous diodes located in focal plane 114 of the array detector 110.

For an opsistor camera designed for visible light (450 nm to 660 nm), the detector arrays on substrate 150 are fabricated from a 20 micron thin silicon membrane. Substrate thickness must be matched to the light wavelength because different colors will penetrate into the silicon to different depths. The orientation of the silicon (1-0-0 vs. 1-1-1) is important because the opsistor imager must possess near equal photonic response from either side. Throughout this disclosure, the array detector being referenced is fabricated from 30 ohm-cm, 1-0-0 float zone, N-type silicon. However, it is to be understood other thicknesses and orientations and substrate materials may also be used depending on the desired application.

For proper camera response in the ultra-violet and the infra red wavelengths, material modifications are required but the basic opsistor approach remains the same. Substrate materials may also be P-silicon, gallium arsenide, diamond, amorphous silicon or any other semiconductor compatible material. Various combinations of PN, NP, PiN, NiP or equivalent junctions may be used to fabricate the active pixels.

Each detector unit 151 (pixel element) in the array detector 110 consists of adjacent front capture and rear reference PiN photodetectors such as diodes 152 and 154 electrically connected in an opposing fashion. Pixel dimensions can range from sub-micron to tens of microns depending on the image application and the performance desired. Light from the front of the detector array 110 will only excite the front capture diode 152 in focal plane 112. The rear reference diode 154 is exposed only to light from the rear of the array detector 110 generated by the ASIC 200. This discrimination is achieved by a combination of layout design and aluminum masking as will be explained with reference to FIG. 6.

The front capture diode 152 has a light sensitive region which includes a P doped layer 158 which forms an intrinsic region 160. A P+ doped layer 162 (anode) is located on the P doped layer 158. An N+ layer 164 (cathode) is formed on the other side of substrate 150 opposite from the P doped layer 158. The N+ layer 164 (cathode) is in contact with a metal layer 166 which is preferably aluminum and both serve as the cathode of the front capture diode 152. The rear focal plane 114 is identical in construction to the front focal plane 112 except for the placement of pixel electrodes.

Thus, the rear reference diode 154 has a P doped layer 168 which forms an intrinsic region 170. A light sensitive region includes a P+ doped layer 172 which is located on the P doped layer 168. The rear reference diode 154 receives light from a reference image which will be explained below. An N+ layer 174 is formed on the side of substrate 150 opposite from the P doped layer 168. The N+ layer 174 is in contact with a metal layer 176 and both serve as the cathode of the rear reference diode 154.

An electrical connection layer 178 is formed on the front capture diode 152 and is in contact with P+ layer 162. P+ layer 162 and electrical connection layer 178 together are the anode of the front capture diode 152. The electrical connection layer 178 is a preferably a patterned aluminum mask which is open around the pixel areas such as the P+ layer 162. Alteratively, connection 8 layer 178 may be other conductor material or a transparent conductor such as indium-tin oxide similar to that used with conventional liquid crystal displays (LCDs). The advantage of a transparent conductor is the ability to form layer 178 directly over the front capture diode 152. The electrical connection layer 178 also provides an electrical connection between the anode of the front capture diode 152 and the cathode of the rear capture diode 154.

Similarly, an electrical connection layer 180 provides an electrical connection between the anode of the rear reference diode 154 and the cathode of the front capture diode 152. The electrical connection layer 180 is composed of separate interconnections on the rear focal plane 114 for each detector 151 such as front and rear diodes 152 and 154. The connection layer 178 is a common interconnection on the front focal plane 112 for all detectors 151 such as front and rear diode 152 and 154.

High electrical isolation between the front capture diode and the rear reference diodes of each detector 151 and between adjacent detectors 151 is accomplished with isolation channel stops 182 formed through the substrate 150. The channel stops 182 are created by P+ doping. Since the P+ channel stop 182 reaches completely through the substrate 150, the P+ channel stop 182 prevents electrical crosstalk (leakage) between pixel elements thereby increasing picture contrast. The channel stops 182 are capped by two oxide layers 184 and 186 which isolate the metal and conducting layers 176 and 178 and 166 and 180 from the substrate 150.

The array detector 110 is mounted on the ASIC 200 by a series of bumps 188. The bumps 188 are fabricated from indium in the preferred embodiment but reflow solder contacts, aluminum alloying contacts, and the like may also be used. The bumps 188 are overlaid onto the metal layer 166 to create contact with the N+ doped layer 164 of the front capture diode 152 and the P+ doped layer 172 of the rear reference diode 154. Each bump 188 conducts the difference voltage signal provided from each detector 151 to the ASIC 200 for further processing as will be explained below.

In the preferred embodiment, the support ASIC 200 is fabricated in a normal manner. The ASIC 200 has processing circuit elements 202 located directly behind the rear focal plane 114. The circuit elements 202 contain scanning, summing and digital compression circuits required to perform real time image processing on-chip. Ample silicon area for electronics is available on surrounding the ASIC 200. A pixel element such as detector 151 may have an area of 30 um by 30 um. This equates to 1,800 square microns (30 um×30 um×2 sides) of available silicon area at the ASIC 200 to interface with each detector 151. With sub-micron design rules, the required processing electronics for each pixel element can be easily fabricated within this limited area on the ASIC 200. Depending on the application, the array detector 110 and the ASIC 200 will range between 20 to 150 microns in thickness when completed. In its final package form, a standard ceramic carrier is used to interface the array detector and ASIC package to the outside world. This package is fully sealed except for a flat window that exposes the front focal plane 112. The opsistor image system 100 will look very much like a standard CCD chip found in a typical consumer camera.

As shown in FIG. 6, the ASIC 200 has a light emitter array comprised of photo or light emitters such as an emitter 204 which is a LED in the preferred embodiment. Each emitter such as emitter 204 is in close proximity to a corresponding rear reference diode such as the rear reference diode 154. Planar emitter technology can produce micro-sized emitters arranged in a monochromatic or color format. Processing steps of planar micro-emitters are also compatible with MOS technology. This allows multiple functions to be performed on the same ASIC silicon chip. A metal pattern mask 190 is formed on the ASIC 200 near the rear reference diode 154. The bumps 188 and the metal pattern mask 190 provide very high aperturing to confine light emissions from the emitter 204 to the corresponding rear reference diode 154 and provide optical isolation between didoes 152 and 154 and also between adjacent detectors 151. High optical isolation is important for achieving between 512 or more levels of gray scale or color and to prevent cross talk from neighboring pixel elements.

With the opsistor detectors (pixel elements), one photodiode serves as a dynamic load for the other photodiode at all times. With the two photodiodes in an inverse parallel configuration, the average impedance during imaging is half of that compared to a single photodiode and thus RF noise resistance is improved and higher image quality can be realized especially in low light. The dynamic impedance of the opsistor detectors (pixel elements) also translates into higher photo response speeds. For a 1 bit black/white video (used in 2-D shadow comparators), the opsistor detector can theoretically support frame speeds 20,000 frames per second with a 20 nanosecond response emitter array.

Furthermore, by using a second photodiode within the opsistor detector to accomplish differential imaging, many optical coupling benefits offered by traditional "optical couplers" can be realized. The opsistor image processor 100 can be effectively isolated from the ground reference of the post processing electronics ground. This prevents crosstalk known as "pattern noise" which occurs because post processing electronics contain periodic digital clocks that generate digital current "spikes." The isolation of the array prevents compromising the signal to noise performance. Additionally, parasitic concerns such as leakage from temperature, for example, tend to offset each other because of the matched but opposing characteristics in the opsistor photodiode pair. If the impedance coupling between the post processing electronics and the detector array is kept high, digital noise may be minimized and even eliminated. The opsistor technology permits coupling impedance between imager and post processing electronics to exceed $10^{14}$ ohms while the average impedance at the sensor array is only a few hundred ohms due to the opposing characteristics of the opposing photodiode pair.

The processing circuitry 202 will now be explained with regard to FIG. 7 which is a circuit diagram of the electronics of the detector array 110 and the ASIC 200. Each reference detector such as rear reference detector 154 on the rear focal plane 114 is illuminated by a dedicated light source such as emitter 204 on the ASIC 200. Each emitter such as emitter 204 is controlled by a difference circuit. The difference circuit produces a difference signal indicative of the difference between a reference image projected on the rear reference diode 154 and the image sensed by the front capture diode 152. The difference circuit includes a closed loop FET amplifier 206 coupled to the emitter 204 which monitors the error voltage at its opsistor pixel element. Within 10 microseconds after gating (100 Khz rate), all the pixels of the array detector 110 can achieve rebalance or electronic null. At this point, the incident light from image 106 focused onto the front focal plane 112 has effectively been transferred to the rear focal plane 114 and becomes the new reference image for the next frame.

The conductor layer (anode) 178 of the front capture diode 152 and the metal layer (cathode) 176 of the rear reference diode 154 are connected to a common voltage bias or common voltage reference which may be a voltage source 208. The voltage of the source 208 can be any value between the supply voltage rails for the circuit. This "floating" feature or common mode property allows the opsistor pixel signal to be biased directly into the linear range of the FET amplifier 206 without extra circuitry. This arrangement also keeps the electronics per pixel to a minimum and preserves simplicity.

The metal layer 166 (cathode) of the front capture diode 152 and the conducting layer 180 (anode) of the rear reference diode 154 are coupled through the bump 188 to a MOS switch 210. The MOS switch 210 is connected to the gate of the FET input amplifier 206. The gate of the FET amplifier 206 is also connected to a capacitor 212. The drain of the FET amplifier 206 is coupled to a voltage source while the source is coupled through a resistor to the emitter 204. The capacitor 212 performs as a sample and hold device for the input signal to the gate of the FET amplifier 206.

Light striking the front capture diode 152 produces a phased voltage signal from 0 and 450 mV in the preferred embodiment. This signal is input to the FET amplifier 206 through the MOS switch 210 and charges the sample and hold capacitor 212. When the MOS switch 210 is closed, the emitter 204 tracks the light level of the diodes 152 and 154. When the MOS switch 210 is open, the capacitor 212 keeps the output of the FET amplifier 206 "held" to its last state to serve as the reference image. The "held" output in turn maintains the output of the emitter 204 at a fixed level. In this HOLD mode, tracking between the diodes 152 and 154 and the emitter 204 is temporarily interrupted.

The output of each opsistor detector 151 (pixel element) such as from diodes 152 and 154 during HOLD mode is sensed by a dedicated pixel error operational amplifier 214 with one input coupled to a reference source such as ground. The other input of the amplifier 214 is coupled to the cathode of front capture diode 152 and the anode of rear reference diode 154. The amplifier 214 is configured such that its output is zero volts whenever "null" is maintained. Null is achieved when illumination from the combination of FET 206 and emitter 204 to the rear reference diode 154 is equivalent to the intensity from the incoming image on the front capture diode 152. This condition remains true during HOLD only if the diodes 152 and 154 sense no change in light intensity between frames. Any pixel element detecting an intensity change during HOLD will cause a positive or negative output signal at its corresponding error amplifier such as amplifier 214. The time duration of the HOLD is equivalent to the shutter speed time of the camera 102.

The opsistor image processing system 100 follows a two step sequence during image sensing. The first step regulates optical feedback to achieve null while charging the sample and hold capacitor 212. This "mirrors" a current image onto the rear focal plane 114. This reference image is then used in the subsequent frame to perform differentiation analysis. The second step is the HOLD mode where a differential video signal is sensed by the error amplifier 214. The voltage output from the error amplifier 214 is proportional to the image change detected by that pixel between frames. If no change occurs for that pixel element, the output of the error amplifier 214 remains at ground or zero volts. Other functions of frame sync, line sync, video signal summing and video data compression are also performed by the processor 120 (not shown in FIG. 7) during the HOLD state as described below. At the end of HOLD, null is restored simultaneously for all pixels and the cycle repeats.

In operation, a first image (frame) is captured by the array detector 110 and digitally processed by the processing circuit 116 and the analog to digital converter 118 on the ASIC 200. The next image (frame) captured by the front focal plane 112 is balanced in real time by a reference image projected on the rear focal plane 114 by the light emitters such as emitter 204 of the ASIC 200. For example, the picture pattern at frame number 1 is processed normally and then this image is transposed to the ASIC 200 abutted to the rear of the opsistor array detector 110. At this moment, all opsistor photodetector outputs will be nulled to "zero volts". If the next frame is the same as frame number 1, all the opsistor pixel elements would remain unchanged. This frame would read out as one "page" of zeros. If frame number 2 has areas of image change, only those pixels will yield voltages proportional to its difference. The outputs from the opsistor array detector 110 are a frame map of the differences between successive video frames. The differences between successive frames are embodied in the different light intensities to those pixels which have been changed. This information is then processed for compression purposes. This procedure continues for subsequent frames. As with conventional compression techniques, reference frames which include all pixel values in an image, are processed periodically.

Once the differential intensity information has been processed, the reference image projected from the ASIC 200 to the rear focal plane 114 of the detector array 110 is again updated. All the opsistor pixels will return to the "zero volts" state. When frame number 3 is processed, the above cycle will repeat. This method of differential image processing minimizes demand for external computations and restricts attention only to pixels that change.

In video image processing, the majority of frames in a similar scene will change around 5% per frame. At VGA resolution of 640×480×3 colors, each frame contains 921, 600 pixel amplitudes. Assuming 5% picture change between the n and n+1 frames, 46,080 color pixel amplitudes will show differences while the balance of 875,520 pixel amplitudes would stay unchanged. The output of the ASIC 200 will allow a conventional compression routine run by the processor 120 to make comparisons on a row by row or column by column basis to determine which pixels have changed. The different pixels are then scanned to determine the new light levels and the new frame may be stored. Thus, only 5% of the data must be stored by the processor 120. The array detector 110 allows the compression routine to locate the changed pixels instantly by detecting which pixel elements have voltage values instead of making comparisons between pixels.

Normally with conventional technology, each pixel of each frame must be processed through the analog to digital converter 118, characterized by the host processor 120 and compared pixel against pixel to yield an error map for the frame differences. This is an extremely demanding process in terms of time and processor power.

Figure 7:
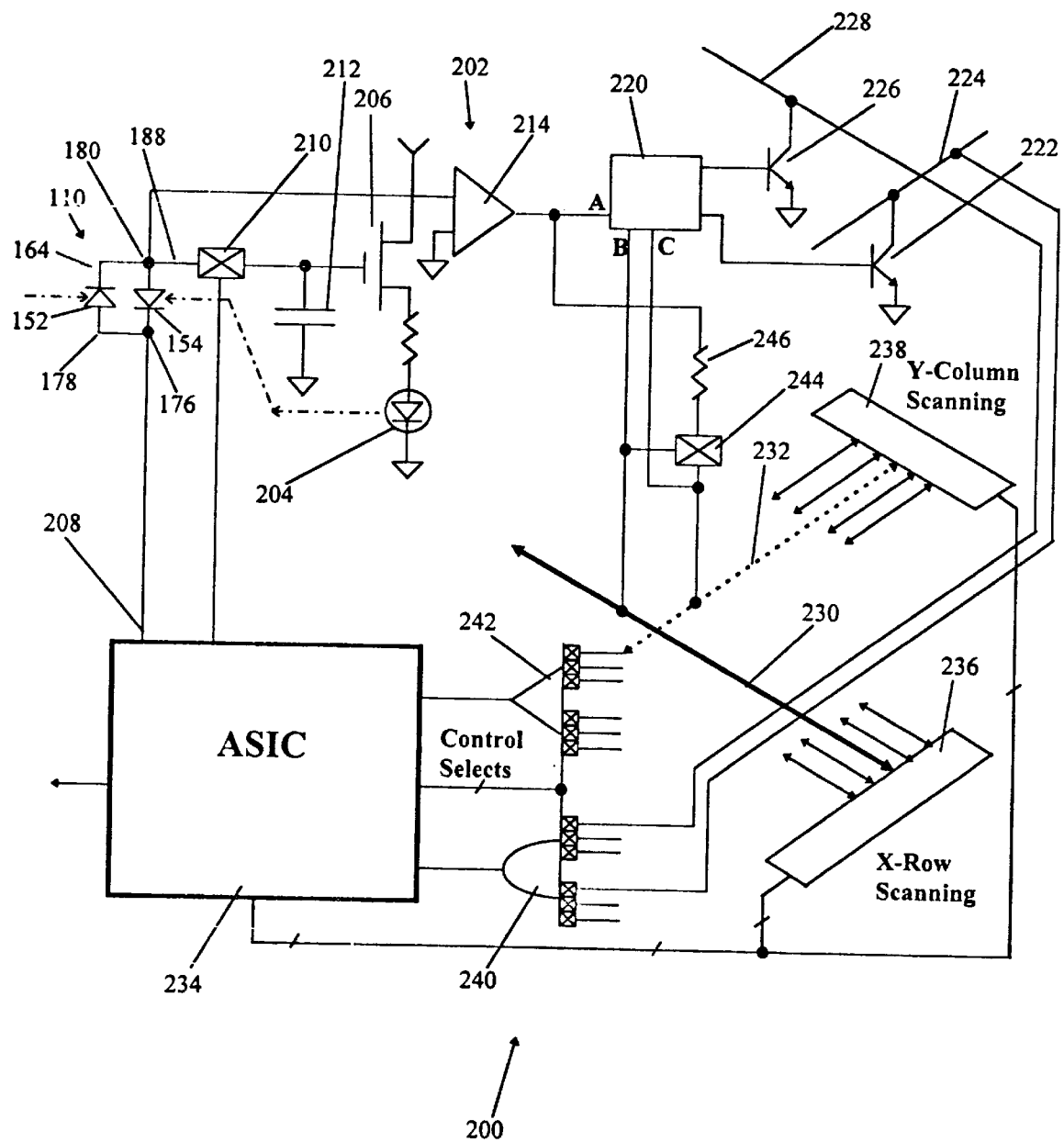
FIG. 7 is a circuit diagram of the array detector and processor according to the present invention.

The ASIC 200 in FIG. 7 takes further advantage of the fact that a typical output frame from an opsistor pixel array will predominantly contain "zeros" (pixels with no change) while pixels showing change will be at some voltage magnitude, positive or negative. In processing, the majority of "zero volt" pixels can be determined by rapid row and column scans as will be explained below. Most of the rows and columns will not be changed. However, once a change is found, the elements in those rows and columns may be located for storage by finding the elements in those rows and columns which are unchanged i.e. are at zero volts. The changes may be rapidly ascertained by the use of a more accurate approximation of the pixel levels which will be explained below.

Every opsistor detector 151 (pixel element) such as the combination of diodes 152 and 154 is coupled to the FET amplifier 206, a comparator 220 and the error amplifier 214 tracking its output voltage referenced to ground. A change of two LSB (least significant bit) positive or negative voltage levels, determined by the range of the analog to digital converter 118, at the output of the error amplifier 214 is validation that a change has been detected for that pixel between frames. Of course, greater or lesser validation levels may be used instead of two LSB. When this condition is detected by the comparator 220, the comparator 220 will enable an open collector transistor 222 tied to a common row COS (change of state) signal line 224 and an open collector transistor 226 tied to a common column COS signal line 228.

All pixels in one row or column are linked into the row COS line 224 and column line COS 228 via two open collector transistors such as transistors 222 and 226. Any pixel in a row or column can force the respective COS line LOW if that pixel senses an intensity change of two or more bits between frames. By quickly scanning the row COS and column COS lines such as lines 224 and 228, the ASIC 200 can rapidly determine which pixels of a frame did not change between frames.

For example, the row COS line 224 is shared by all pixels in that row. The window comparator 220 controls the two transistors 222 and 226 tied to the respective row and column for a given detector 151 (pixel element) (i.e. diodes 152 and 154). The comparator 220 is responsive to an input voltage greater than or equal to +2 bits or less than or equal to −2 bits with respect to ground. This is accomplished using normal comparator circuits that respond only to the absolute value of an input voltage relative to ground. The acceptance "window" for no-change are input voltages less than +2 bits but greater than −2 bits. Each output of the internal comparators of comparator 220 then drives their respective open collector transistors 222 or 226.

The window comparator 220 has an input B and an input C. Address lines such as a row address line 230 and a column address line 232 can disable the COS contribution from any row (at input B) or column (at input C) by going LOW. The output of the error amplifier 214 is connected to window comparator 220 at input A. In effect, the X-row and Y-column address lines such as lines 230 and 232 can control COS functions as well as summing functions.

When a new frame scan starts and differential information is sensed, the ASIC 200 will proceed to isolate domains of pixel change by a control circuit 234 which may include the reference voltage 208. The control circuit 234 contains output circuitry to produce the digital video signal. Additional the control circuit controls the sample and hold cycle for all pixels elements by the switch 210. The control circuit 234 controls the X-row address lines such as line 230 and the Y-column address lines such as line 232 through a standard row address presettable counter 236 and a standard row address presettable counter 238. The control circuit accepts inputs from a change of state logic circuit 240 and a summing and scanning amplifier 242 which provide various differential pixel values which will be explained below.

The control circuit 234 will first interrogate all row COS lines such as line 224 and drop out the rows with non-changing pixels. The row and column COS lines 224 and 228 are also multiplexed into the control circuit 234 by the change of state logic circuit 240. Any number of COS lines can be sensed by the control circuit 234 at one time to determine which rows and/or columns possess identical data to the previous frame. Such rows or columns are then dropped from further concern. The control circuit 234 then evaluates the change of state of all columns and likewise drops out all columns with identical data to the previous frame. The remaining pixels in the array 110 which have changed data are then scanned one pixel at a time.

Individual pixel scanning is accomplished by the row address presettable X counter 236 and the column address presettable Y counter 238. The X counter 236 is connected to all row address lines such as row address line 230. The Y counter 238 is connected to all column address lines such as column address line 232. The preset function allows random selection of any row(s) and any column(s) by direct control. This random addressing permits extremely fast pixel scanning within the array.

Once row and column addressing converges to a particular pixel, the output from the error amplifier 214 for each pixel element is connected to the summing and scanning amplifier 242 through a MOS switch 244 dedicated to that pixel element. The control circuit 234 can now perform all summing and analog to digital conversion functions. Summing resistors such as a resistor 246 for each pixel allows the ASIC 200 to use this circuit as an analog adder.

If no pixels change across the full frame, the image from the array detector 110 is evaluated in one clock cycle. For every new frame, the control circuit checks the COS lines such as lines 224 and 228 and the summing and scanning amplifier 240 at the same time. If none of the COS lines toggled, the current image is identical to the previous frame and little action is required. A coded sequence is sent to the digital video output indicating a "same state frame" and the system waits for the next frame.

If a COS row or column line is triggered, the control circuit 234 will compare the magnitude of the frame error against an internal limit. This full-frame summed signal represents the total activity recorded by all pixels in the row or column. Varying degrees of image jitter can be qualified and allowed by evaluating this sum limit. The higher the limit, the greater are the cummulative pixel variances allowed before row/column scans are initiated.

For machine vision, this COS feature allows an image "in-lock" to exhibit slight variations or jitter and still avoid rescans. This level of activity represents minimal burden to the controlling ASIC 200. The advantage is maximum camera response speed once motion begins. In impulse type applications, the shape of a "locked image" is relatively unimportant but once motion starts, it must be tracked or retargetted as fast as possible, even if the shape rotates or shifts abnormally.

The output from each pixel's error amplifier 214 is connected to the its column address line such as column address line 232 by the switch 244 and read by the control circuit 234. The video summing and scanning amplifier 242 senses array signals in one of two ways. It can address each pixel one at a time or examine random areas of pixels (up to the full array) all at one time.

The Y-scanning column decoder 238 is controlled by the control circuit 234 and any combination of column address lines can be HIGH, LOW or in tri-state during a scan. Likewise, any number of X-scanning row address lines can also be selected by the X-scanning row decoder 236 to go HIGH, LOW or tri-state during a scan. With this degree of control, the control circuit 234 can process the array signals in several ways.

1) Full Imager Array Scanning: In this mode, the control gates such as switch 244 of all pixel elements are enabled by setting every X-row adress line, such as line 230, HIGH. At the same time, all Y-column addressing lines, such as line 232, are switched to tri-state. The switch 244 thus connects the output of the error amplifier 214 to the summing resistor 246 for all of the pixels elements. This mode adds all the pixel signals into the summing amplifier 242. The output of amplifier 242 is now the sum of all pixels in the array 110.

2) Partial Imager Array Scanning: In this mode, only selected Y-column and X-row address lines are tri-stated and placed HIGH respectively. The Y-column address lines such as line 232 that are removed from scanning will be in a LOW state. This low state results in zero signal contribution to amplifier 242 from each deselected column. On active columns, desired rows can still be turned off by setting these X-row address lines LOW. A signal LOW at any X-row address will force all gate switches such as switch 238 off for pixels in that row. In this manner, any array area can be selected randomly and analyzed in parallel.

3) Boundary Scanning: Once a pixel or a feature has been located in the array, those pixels can be "contained" by testing the Y-columns and X-rows that bracket the feature like a picture frame. Scanning authority will concentrate on the specific COS-rows and COS-columns composing this picture frame. As long as the target image stays within the frame, the frame will not move. As soon as motion is sensed by a pixel violation penetrating into the frame, the frame will immediately compensate and recenter itself over the moving target (within limits of the sensor array surface). The image processor 100 therefore has the ability to "capture" an image by summing, then "lock" onto this target with COS scanning.

4) Random Access Pixel Scanning: Any pixel in the array can be read with random access scanning. A specific pixel is selected by setting all Y-column address lines LOW except for the column of interest which is left in tri-state. For rows, all X-row addresses are LOW except for the row of interest. This addressing state forces all pixels in all columns to have zero contribution to the summing amplifier 242. In the specific column selected, every pixel is disabled by a LOW on the X-row addresses except for the single row selected which is HIGH. Therefore, the single pixel selected is the only switch 244 that is connected into summing amplifier 242. This random access technique features a fast access time with a speed similar to static RAM at below 50 nanoseconds (this time is part of the general stabilization time for opsistor "null" at 10 usec).

The total error deviation away from 0 volts is then used to determine a "best guess" for analog to digital conversion for those rows. If all pixels in the array were summed simultaneously, a correlation fit is then established between the current image and the last reference frame. The better the match between these two frames, the lower is the total error weight (maximum correlation).

For example, if 10 pixels were summed and all pixels had a +2 LSB deviation from ground, the summing amplifier 242 would produce a +20 LSB weight as a result. This value is used in the ASIC 200 to determine a "best guess" analog to digital starting point which is selected from a range of reference values as a correlation "fit" for that frame. The smart guess will start with an initial reference level very close to ground since the error magnitude (average if 2 LSB) is quite low.

Even if the 10 pixels above were randomly distributed within 1 million unchanged pixels, the resulting sum will still be +20 LSB since the other pixels are at zero volts. Unchanged pixels are basically invisible but error variations clearly stand out. If no pixels had changed in this example, the output would still be +0 LSB, regardless of the total pixels involved.

Pixels requiring digital conversion are processed using successive approximation but aided by a "smart guess" by the analog to digital converter 118. In a normal successive approximation analog to digital converter, the first reference used is always a midpoint guess. If the pixel voltage is at 0.1 volts (for a 1 volt full scale range), the analog to digital will start its first comparison at 0.5V and conclude that the pixel voltage is lower. The next guess will be half the value of the first or 0.25V. Again, the conclusion is that the pixel voltage is less. The next half value guess is at 0.125V and again the conclusion is less. The next guess at 0.062V, however, concludes that the pixel voltage is now more. Successive approximation will now use 50% of the value between 0.062V and 0.125V or 0.093V for the next test. Each additional test continues to narrow in on the true voltage value of the pixel. For an 8 bit analog to digital converter, eight divisional comparisons are always performed regardless of the true pixel voltage.

With the opsistor "smart guess" approach, the range of the pixel error voltage is already known from the output of the summing amplifier 242. This value is compared with various reference points and the closest reference point is selected from the first guess. For the above example, the smart guess will start at 0.125V which is derived from the output of the error amplifier 214 (2 LSB) instead of 0.5V thereby saving at least 2 of the 8 successive comparisons. On the average, an opsistor 8 bit digitization is 25% faster than similar analog to digital converters.

Other converter technologies like flash analog to digital conversion can also be used. If the range of a conversion is known (as in the case of the opsistor imager), a smaller flash analog to digital conversion (4 bits) with level shifting can match the performance of a much larger (12 bits) flash converter.

Summing determines correlation fit between a current frame and its earlier reference. The closer the sum error is to zero, the easier it is to compress the pixels for that frame. With summing, it is important to be able to differentiate a "zero change" frame that is truly without change from one where the number of +LSB changes are offset by an equal number of −LSB changes. This last condition will also produce a net sum of zero. The opsistor imager eliminates this problem by reading the COS line during sums. Because the COS line is coupled to window comparator 220, it is not sensitive to polarity and only responds to absolute values.

When digitization is completed by the analog to digital converter 118, the processor 120 will compress the digititized data using a standard run length compression routine. During this process, framing and synchronization signals are added to the video data. The data output from the opsistor camera 102 is highly dynamic in size. It will range from very short transmissions for "no-change" frames to long data streams for complex changing images. Even at its maximum data stream, the opsistor camera 102 is still many times faster than a serially scanned CCD or diode array. For example, even if the input picture is random noise the opsistor image processing system can still take advantage of the fact that the average intensity change will be around zero. At any instant for 8 bits resolution, assume the noise profile is to contain ⅓ of pixels with no change, ⅓ with +/−25% change and ⅓ with +/−50% change. All columns and rows would have to be scanned since there is no chance of dropping any area. During analog to digital conversion, however, pixels closer to zero volts are decoded faster. The three pixel groups are decoded in ¹⁄₁₀, ¾, and ⅞ of the time normally required for analog to digital conversion. This equates to only 57% time utilization (⅓×¹⁄₁₀, ⅓×¾, ⅓×⅞) or a savings of 43% compared to standard A/D processing. For any size array, therefore, opsistor imaging is still significantly faster even when processing noise.

A more typical example of image processing performance by the system 100 is as follows. A 1024×1024 machine vision camera changes 2% of its pixel between the n and n+1 frames. The error weight of all 1024 rows and 1024 columns are now determined in 2,049 machine clock cycles (1 clock cycle for frame correlation, 2,048 clock cycles for rows and columns). At 100 MHz, this equates to 21 microseconds. The 2% changed pixels are confined to 300 rows and 200 columns which is a typical machine vision situation if a part being examined exhibits a defect. At this time, the full frame has been shrunk down to a much smaller 300×200 array.

To examine these 60,000 pixel locations, a very fast analog to digital converter requires 600 microseconds at 100 MHz. Within these 60,000 locations, however, only 20,971 bits have changed. The imaging system 100 processes non-changing pixels in 10% of the time required for a full analog to digital conversion. For these 60,000 pixels, the imaging system 100 will process 20,971 pixels in 157 usec (100 Mhz rate×20,971×0.75) and 39,029 pixels at 39 usec (100 Mhz rate×39,029×0.1) totaling 196 microseconds. The imaging system 100 thus requires 217 usec (21 usec+196 usec) to fully process the frame. This image data is then compressed and formatted before leaving the camera 102.

In comparison, a standard high speed camera must first off-load all 1 million pixels (1,048,576) from the imager. At this point, 14.48 milliseconds have passed (at 100 Mhz rate) and it is still not known what pixels have changed. To move this information into a computer, over 8 Mbits of information must be transmitted for an elapsed time of 80 milliseconds (at 100 Mbits/second) The data must still be processed. Each pixel will require approximately 10 processor clocks to test it against a reference value. With a 300 MHZ, RISC computer, 10,048,576 clock cycles are required to compute this data equating to 33.5 milliseconds. In total, a traditional high speed machine vision system would need 124 msec. (80 msec+43.98 msec.) to reach the same result the opsistor system reached in 217 microseconds.

The opsistor camera 102 has an unparalleled advantage because of the differential property within each pixel and the ability to use zero volts for encoding a "no-change" image state. In the above example, additional time for compression and overhead must be added to compare total performance. Assuming another 2 msec. are required to perform a decision based on the differential image, the opsistor camera will still demonstrate a 56 times faster speed advantage. For a "pass frame" not requiring I/O action, the advantage increases to 571 times. With no pixels changing between frames, the advantage is incalculable.

Thus, opsistor technology holds many potential benefits for digital video. The opsistor based array detector functions like a digital video camera except that it outputs only the differences between frames. This "difference" can be directly compressed or stored on tape like a standard CamCorder. Another advantage is the ability of the opsistor array to support random pixel addressing which speeds the compression of the images for processing.

By performing differential imaging directly at the pixel level of the opsistor video array, additional advantages are gained. Signal to noise ratios of images are higher and processor demands from the host computer is greatly reduced since the central processor 120 and analog to digital converter 118 only needs to compress the differences between frames.

Figure 8:
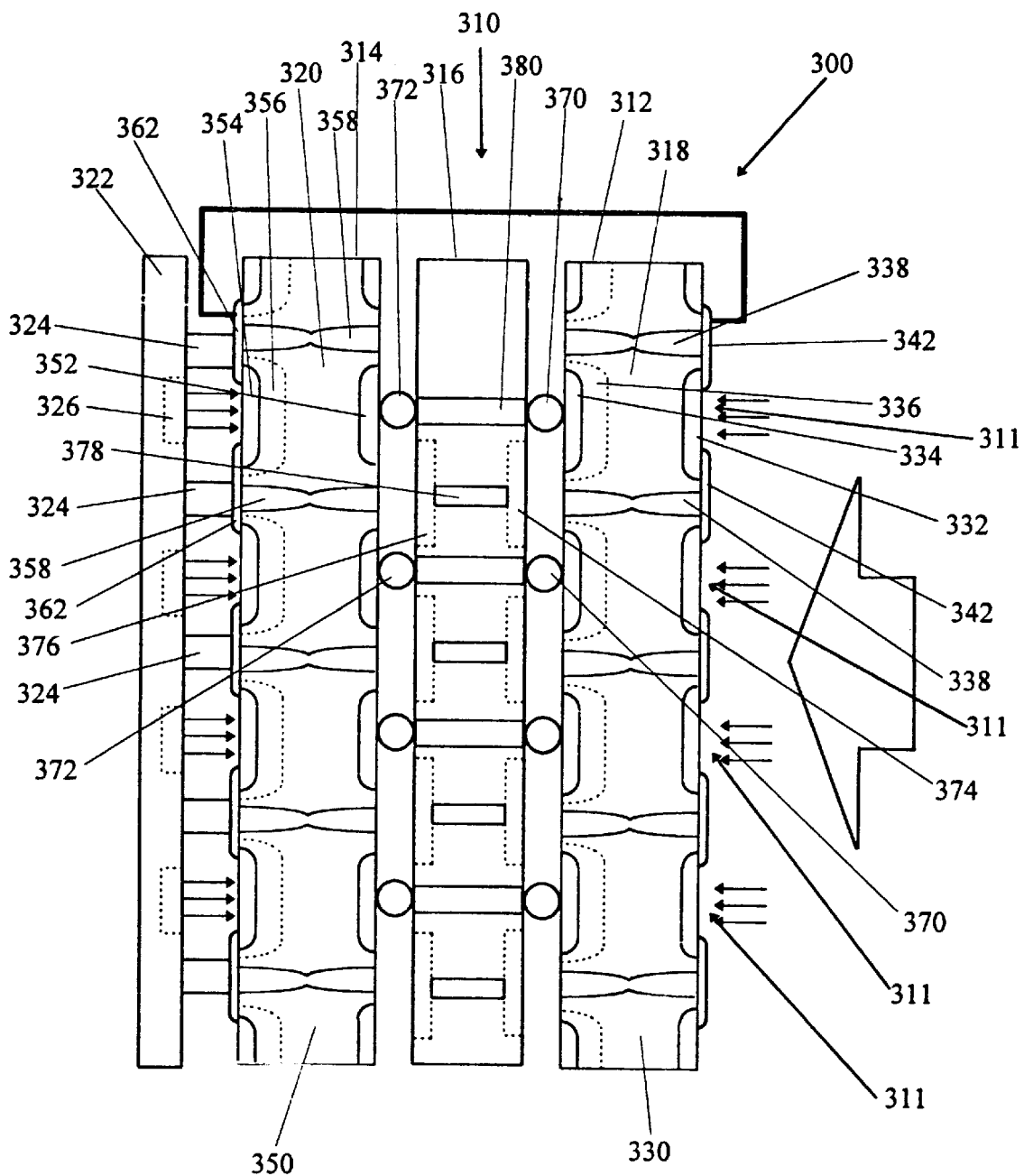
FIG. 8 is a cross section of an image capture array substrate according to an alternate embodiment of the present invention.

An alternative embodiment of the present invention is shown in FIG. 8. An image capture system 300 in FIG. 8 has an opsistor imaging array 310 which includes a front capture array 312 and a rear reference array 314. Processing circuitry similar to that shown in FIG. 7 is provided in the form of a middle electronics layer 316 located between the front array 312 and the rear array 314. It is to be understood that although only one opsistor detector 311 (pixel element) will be described below, an array of such pixel elements in FIG. 8 are located on the front and rear arrays 312 and 314. The opsistor detectors 311 each have a front capture photodiode 318 located on the front array 312 and a rear reference photodiode 320 located on the rear array 314.

The electronics layer 316 is fabricated on a middle substrate which is bonded between the front capture array 312 and the rear reference array 314. An emitter array 322 with micro silicon LEDs 326 matching the rear reference array 314 is abutted to the rear array 314 by a matching aperture grid 324. The light emitting array 322 may be other illumination sources based on LCDs, organic arrays, MEMS arrays, plasma arrays, field emission arrays and the like. The emitter 326 produces a reference light level for the rear reference photodiode 320 to which it is paired on rear reference array 314. Light produced by the LED 326 can only be seen by the rear reference photodiode 320 due to the optical isolation provided by aperture grid 324. The aperture grid 324 is fabricated from silicon and eliminates the possibility of optical crosstalk between adjacent opsistor detectors 311.

Both the front capture array 312 and the rear reference array 314 are fabricated in a similar manner. The front capture array 312 is fabricated from a 20 micron, thin N silicon substrate 330. Thickness must be matched to the light wavelength because different wavelengths will penetrate into the silicon to different depths. A P+ layer 332 is formed by doping the front surface of the substrate 330. The P+ layer 332 is exposed to the light from the image. A corresponding N+ layer 334 is formed by doping the rear surface of the substrate 330. An intrinsic region 336 is formed between the P+ layer 332 and the N+ layer 334. The front capture photodiode 318 is isolated from other photodiodes on the front array 312 by channel stops 338 formed by P+ doping through the substrate 330. A metal layer 342, which is preferably aluminum, is formed in contact with the P+ layer 332. The metal layer 342 forms a grid which is in contact with all of the P+ layers of the photodiodes on the front array 312. Of course other conductor materials may be substituted for metal layer 342.

Similarly, the rear reference array 314 is fabricated from a 20 micron thin N silicon substrate 350. A P+ layer 352 is formed by doping the surface of the substrate 350 facing the middle electronics layer 316. A corresponding N+ layer 354 is formed by doping the opposite surface of the substrate 350. The N+ layer receives light from the emitter array 322. An intrinsic region 356 is formed between the P+ layer 352 and the N+ layer 354. The rear reference photodiode 320 is isolated from other photodiodes in the rear reference array 314 by channel stops 358 which are formed by P+ doping through the substrate 350. A metal layer 362 is formed in contact with the N+ layer 354. The metal layer 362 forms a grid in contact with all of the N+ layers of the reference photodiodes on the rear reference array 314.

The front capture array 312 and rear reference array 314 are thus identical in construction except for the placement of pixel electrodes. The front capture array 312 uses the N+ layer 334 for each front capture photodiode such as photodiode 318 to interconnect to the middle electronics layer 316 while the rear reference array 314 is connected with the P+ layer 352 of each rear reference photodiode such as photodiode 320. Both outer surfaces of the front capture array 312 and the rear reference array 314 are patterned with the common metal layers 342 and 362, respectively, that interconnect every opsistor detector 311 with minimal optical obstruction. The two metal layers 342 and 362 are shorted together in the final package and serve as the "common reference" for all opsistor detectors 311 (pixel elements) in the system 300. Thus, for example, the P+ layer 332 (anode) of the front capture photodiode 318 is tied to the N+ layer 354 (cathode) of the corresponding rear reference photodiode 320. This is common for all photodiode pairs of the system 300. This point, as explained above, serves as a common electrical reference.

Electrical interconnection between the electronics layer 316 and the front capture array 312 and rear reference array 314 are through bumps 370 and 372, which may be indium fabricated using the flip chip method. Other accepted interconnection or alloying techniques involving gold, aluminum, titanium, tungsten and the like can also be used. Indium produces reliable diffusive bonds at all contact points with a moderate compressive pressure over a short time period but without the need for heat. This bonding allows the front capture array 312 and rear reference array 314 to be mounted directly onto the middle electronics layer 316.

The middle electronics layer 316 contains all scanning, summing and digital compression hardware required to perform real time frame processing on chip. This hardware is represented by front and rear side electronics 374 and 376. Interconnection between front and rear side electronics 374 and 376 are accomplished with standard silicon vias 378 running through the electronics layer 316. In thin substrate silicon, the vias or "jumpers" are be fabricated by lithography to interconnect devices on both sides. Areas that do not require metal based conductors use ohmic contacts. The through-silicon connections from the front capture array 312 to the rear reference array 314 are accomplished using conductive vias 380. The conductive vias 380 and bumps 370 and 372 electrically connect the N+ layer 334 (cathode) of the front capture photodiode 318 with the P+ layer 352 (anode) of the rear reference photodiode 320 for each such photodiode pair. These layers are connected to a FET feedback gain amplifier (not shown) on the electronics layer 316 as explained in FIG. 7.

Depending on the application, the imaging system 300 will range between 20 to 150 microns in thickness when completed. In its final package form, a standard ceramic carrier is used to interface the system 300 to the outside world. This package is fully sealed except for a flat window that exposes the front surface of the front capture array 312. The package will look very much like a standard CCD chip found in a typical consumer camera.

The advantages of this embodiment stem from the location of the processing circuitry in the electronics layer 316 which provides optical isolation of the rear reference array 314 layer from the front capture array 312. In this manner, the front capture array 312 and rear reference array 314 may be separately fabricated to achieve higher pixel resolution. It also allows the electronics layer 316 to be separated from the emitter array 322. This decreases integration complexities and also provides more silicon area under each pixel for processing circuitry.

Additionally, the components on front capture array 312 may have low impedance (similar to the array device 110 of FIG. 6), but the components in the electronics layer 316 may be further optimized for higher impedance. This substantially reduces noise and cross talk from distorting the image signals. High impedance allows performance advantages from state-of-the-art submicron CMOS/FET amplifiers to be used for the circuit components in electronic layer 316. Multiple functions such as mixed mode analog circuits can coexist in electronic layer 316 without creating crosstalk problems with the detectors 311. Because the opsistor requires no high bias voltages, it is a useful sensor device for ASICs with supply voltages reaching sub-2V levels and power consumption at absolute minimums.

Additionally, the detector outputs may be moved to any voltage bias desired by biasing the common metal layers 342 and 362. The bias point at low operating voltages will normally be at a level that will directly drive a FET amplifier. The opsistor is biased without additional circuit complexities by the common voltage bias points coupled to the detectors. Additionally, no additional DC bias power is required since the supply voltage or any other circuit voltage may be used.

The opsistor image system will permit videophone communications through existing telecom bandwidth and central office equipment limitations. This bandwidth is a narrow 4 Khz or 56 Kbits per second as defined by the T1 standard. A picture phone based on the opsistor camera better utilizes the limited bandwidth of a standard telephone line. Differential images may be off-loaded from the opsistor, weighed for importance and compressed at a very fast rate. The compression scheme used can be identical to the best performing algorithms (Cosine, Factal, MPEG-I,II, etc.) available. Since the opsistor imaging system only requires differential data, less data needs to be transmitted per frame. This improves the bandwidth utilization of the phone line to produce a higher quality image.

The opsistor can weigh different levels of image light changes in real time and determine which areas are more important to track. This selectivity enables the video transmission to use a priority coding scheme driven by picture segment correlations to previous frames. The weaker this correlation, the higher is its weight or priority for processing. For images that are primarily displaced in X-Y space (like the head position of a person during a conversation), the correlation feature allows full frame shifting of the reference image to achieve acceptable correlation without re-encoding the whole picture. All of these powerful tools work together to create an extremely efficient technique for a streaming video picture phone. The phone line is pushed to greater utilization with a very dynamic and efficient data protocol resulting is a color picture that will quickly track motion (people, faces, etc.) and sound. With slower moving images, higher resolution may be achieved. When picture segments are moving quickly, resolution is proportionally reduced or "down shifted" but the image stays coherent and resists break up much longer than other streaming video techniques.

For machine vision applications, quality and productivity are key. A high speed rotary stamping machine can produce thin stampings at over 1,000 stampings per minute. A two dimensional shadow image of a gear, for example, can be repeatedly inspected in under 330 usec. per frame. This equates to a speed of 3,000 frames per second. The part can be in any orientation as captured by the camera. Parts with irregularities are rejected in real time. With repeated framing, the reference image which may be input from a computer database is electronically shifted over the shadow image, rotated and scaled up or down until optimum correlation is achieved. This can be accomplished in under 10 frames or within 3.3 milliseconds. With additional time added for other system overhead, full correlation in this example can be completed in under 4 milliseconds. This translates to 250 gear inspections per second or a run rate of 15,000 parts per minute (or 1,000 parts per minute with 15 different inspections per part).

Similarly, the opsistor imaging system may be used as a terrain tracking instrument. Images loaded into the opsistor camera computer may achieve land terrain lock at high correlation factors. Once in lock, the reference images are played in the opsistor camera until it homes in on the desired target. With two opsistor cameras separated by 7 to 10 degrees, 3-D imaging is also possible for added depth perception or triangulation.

In the security field, the opsistor imaging system can offer a new generation of user identification devices. Finger print scanners allow a party to place their thumb onto a glass plate to accentuate contrast for camera imaging. The processed file is then matched against valid files in memory and the finger print is accepted or rejected. Optical image matching applications are enhanced by opsistor imaging. With finger print comparison, the opsistor detector array functions like a traditional camera but offers direct reference comparisons for speed and accuracy. Such an approach can also help law enforcement in areas of facial images, retinal images, and even DNA matching. The opsistor scanner/camera can be in bar, circular or multiaxis configurations.

It will be apparent to those skilled in the art that various modifications and variations can be made in the method and system of the present invention without departing from the spirit or scope of the invention. The present invention is not limited by the foregoing descriptions but is intended to cover all modifications and variations that come within the scope of the spirit of the invention and the claims that follow.

What is claimed is:

1. An image processing system for capturing and compressing a series of images from an image source, the system comprising:
    an image array having at least one pixel element, each pixel element having:
        a capture photo detector having an anode and a cathode, the capture detector in exposure to the image source;
        a reference photo detector having an anode, a cathode, the anode of the reference detector being electrically coupled to the cathode of the capture photo detector, and cathode of the reference detector being electrically coupled to the anode of the capture detector;
    a light emitter array having at least one light emitter corresponding to each pixel element, wherein the light emitter emits light on the reference detector; and
    a processing circuit electrically coupled to each pixel element and each light emitter, the processing circuit projecting a reference image from the light emitter on the reference detector and comparing the reference image with the image sensed by the capture detector.

2. The image processing system of claim 1 wherein the processing circuit includes a difference circuit for each pixel element, the difference circuit producing a difference signal indicative of the difference between the reference image projected on the reference detector and the image sensed by the capture detector.

3. The image processing system of claim 2 wherein the difference circuit further comprises:
    a switch for each pixel element coupled to the cathode of the capture detector and the anode of the reference detector;
    an amplifier for each pixel element with a gate coupled to the switch, a source coupled to the light emitter, and a drain coupled to a voltage source;
    a sample and hold capacitor coupled to the cathode of the capture detector and the anode of the reference detector, the capacitor holding a value of a previous image to serve as the reference image; and
    an error amplifier having an input coupled to a reference source and an input coupled to the cathode of the capture detector and the anode of the reference detector, and which outputs the difference signal when the switch is closed.

4. The image processing system of claim 2 further comprising an analog to digital converter coupled to the processing circuit, producing a digital value of the difference signal.

5. The image processing system of claim 4 wherein the analog to digital converter uses the difference signal to determine a first approximation of the digital value.

6. The image processing system of claim 4 further comprising:
  a processor coupled to the analog to digital converter, the processing circuit forming digital representations of the series of images; and
  a storage device coupled to the processing circuit which stores a digital representation of the series of images.

7. The image processing system of claim 1 wherein the anode of the capture detector and the cathode of the reference detector are coupled to a common voltage reference.

8. The image processing system of claim 2 wherein each pixel element is arranged in a row and a column in the array, the processing circuit further comprising:
  a comparator coupled to the difference circuit of each pixel;
  a change of state column line coupled to the comparator of each pixel element in a column;
  a change of state row line coupled to the comparator of each pixel element in a row; and
  wherein the comparator sets the state column line and state row line coupled to the pixel element low if the magnitude of the difference signal for the pixel element exceeds a validation level.

9. The image processing system of claim 8 wherein the processing circuit further comprises:
  a summing circuit coupled to the change of state row lines and the change of state column lines; and
  wherein the processing circuit is coupled to the summing circuit to determine particular rows of pixel elements and columns of pixel elements where the image sensed by the capture detector has changed from the reference image.

10. The image processing system of claim 8 wherein the processing circuit further comprises:
  a row select circuit coupled to the change of state row lines;
  a column select circuit coupled to the change of state column lines; and
  wherein the processing circuit reads the difference signal of a pixel element by the row select circuit and the column select circuit.

11. The imaging system of claim 1 wherein the light emitters are light emitting diodes.

12. The imaging system of claim 1 further comprising an infra-red waveband filter between the capture detector and the image area.

13. The image processing system of claim 1 further comprising an ultra-violet waveband filter between the capture detector and the image area.

14. The imaging system of claim 1 further comprising:
  a filter passing light at a first waveband between the capture detector and the image area; and
  wherein each pixel element further comprises:
    a second capture photo detector having an anode, a cathode, the second capture detector in exposure to the image source;
    a second reference photo detector having an anode, a cathode, the anode of the second reference detector being electrically coupled to the cathode of the second capture detector, and the cathode of the reference detector being electrically coupled to the anode of the second capture detector; and
    a second filter for light at a second waveband between the second capture detector and the image area;
    a third capture photo detector having an anode, a cathode, the third capture detector in exposure to the image source;
    a third reference photo detector having an anode, a cathode, the anode of the third reference detector being electrically coupled to the cathode of the third capture detector, and cathode of the third reference detector being electrically coupled to the anode of the third capture detector.

15. The image processing system of claim 14 wherein the first waveband is the red spectrum of visible light; the second waveband is the green spectrum of visible light; and the third waveband is the blue spectrum of visible light.

16. The image processing system of claim 1 wherein the image array is fabricated on a monolithic substrate having a front and rear surface.

17. The image processing system of claim 16 wherein the monolithic substrate is N-type silicon;
  wherein the anode of the capture detector is a P+ doped region on the front surface of the substrate; and
  wherein the cathode of the capture detector is a N+ doped region on the rear surface of the substrate opposite the P+ doped region of the capture detector; and
  wherein the a node of the reference detector is a P+ doped region on the rear surface of the substrate; and
  wherein the cathode of the reference detector is a N+ doped region on the front surface of the substrate opposite the P+ doped region of the reference detector.

18. The image processing system of claim 17 further comprising:
  a front conductor layer in contact with the anode of the capture detector;
  a front metal layer in contact with the N+ doped region of the capture detector and the front conductor layer;
  a rear conductor layer in contact with the anode of the reference detector;
  a rear metal layer in contact with the N+ doped region of the reference detector and the rear conductor layer.

19. The image processing system of claim 18 wherein the rear and front conductor layers are metal.

20. The image processing system of claim 18 wherein the rear and front conductor layers are transparent.

21. The image processing system of claim 20 wherein the rear and front conductor layers are indium tin oxide.

22. The image processing system of claim 17 further comprising:
  a support substrate having a front surface;
  a series of bumps in contact between the front surface of the support substrate and the rear surface of the monolithic substrate providing optical isolation between the adjacent reference detectors of each pixel elements; and
  wherein the light emitter array is fabricated on the front surface of the support substrate surface.

23. The image processing system of claim 22 wherein the processing circuit is fabricated on the support substrate.

24. The image processing system of claim 23 wherein the bumps are conductors providing electrical connection between the processing circuit and the cathode of the capture detector.

25. The image processing system of claim 23 wherein the bumps are indium.

26. The image processing system of claim 1 further comprising:
 a middle substrate;
 a front substrate having a front surface facing the image area and a rear surface facing the middle substrate wherein the capture detector is fabricated on the front substrate; and
 a rear substrate having a front surface facing the middle substrate and a rear surface facing the light emitter array, wherein the reference detector is fabricated on the rear substrate.

27. The image processing system of claim 26 wherein the processing circuit is fabricated in the middle substrate.

28. The image processing system of claim 26 wherein the front and rear substrates are N-type silicon,
 wherein the anode of the capture detector is a P+ doped region formed on the front surface of the front substrate;
 wherein the cathode of the capture detector is an N+ doped region on the rear surface of the front substrate opposite the P+ doped region of the capture detector;
 wherein the anode of the reference detector is a P+ doped region formed on the rear surface of the rear substrate; and
 wherein the anode of the reference detector is a N+ doped region on the front surface of the rear substrate opposite the P+ doped region of the reference detector.

29. The image processing system of claim 28 further comprising:
 a front conductor layer in contact with the P+ doped region of the capture detector of each pixel element; and
 a rear conductor layer in contact with the P+ doped region of the reference detector of each pixel element.

30. The image processing system of claim 29 further comprising:
 a series of front bumps located between the rear surface of the front substrate and the middle substrate;
 a series of rear bumps located between the front surface of the rear substrate and the middle substrate;
 a series of conductive vias running through the middle substrate electrically coupling each rear bump with a front bump; and
 wherein a front bump is in electrical contact with the N+ doped region of the capture detector and a rear bump is in electrical contact with the P+ doped region of the reference detector.

31. The image processing system of claim 30 wherein the bumps are indium and attached to the middle substrate and the front and rear substrates by flip chip bonding.

32. The image processing system of claim 30 further comprising:
 an emitter substrate having the emitter array fabricated thereon; and
 an aperture grid located between the emitter substrate and the rear surface of the rear substrate, wherein the aperture grid provides optical isolation between adjacent light emitters and the reference detector of each pixel element.

33. A method of capturing and compressing an image from an image source using an array of optical pixel elements producing a capture voltage level indicative of a captured image, the method comprising the steps of:
 comparing the capture voltage signal of each pixel element with a reference voltage signal from the light level of a reference image;
 determining a difference value between the capture voltage signal and the reference voltage signal;
 determining the pixel elements where no change has occurred between the reference image and the captured image; and
 storing the difference values associated with the pixel elements.

34. The method of claim 33 wherein each pixel element further comprises:
 a capture photo detector having an anode and a cathode, the capture detector in exposure to the image source;
 a reference photo detector having an anode, a cathode, the anode of the reference detector being electrically coupled to the cathode of the capture optical detector, and cathode of the reference detector being electrically coupled to the anode of the capture detector.

35. The method of claim 34 further comprising the step of storing the captured image for use as a reference image.

36. The method of claim 35 wherein a light emitter array having at least one light emitter corresponding to each pixel element is used to project the reference image.

37. The method of claim 33 further comprising the steps of:
 converting the difference value into a digital value; and
 storing the digital values as a representation of the captured images.

38. The method of claim 37 wherein the step of determining the pixel elements where no change has occurred between the reference image and the captured image further comprises:
 coupling each pixel to a change of state row line and a change of state column line;
 setting the change of state row line and change state column line low if any pixel on the row line or column line senses a change between the capture image and the reference image; and
 summing the difference values from the pixels on the change of state row lines or the change of state column lines set low.

39. The method of claim 38 further comprising the steps of:
 selecting the sum of difference values from a change of state row line or the change of state column line;
 determining an average difference value the sum of difference values from the change of state row lines or the change of state column lines.

40. The method of claim 39 wherein the step of converting the difference value includes using the average difference value as a first approximation value to determine the digital value.

41. The method of claim 34 further comprising the step of coupling the anode of the capture detector and the cathode of the reference detector to a common voltage reference.

* * * * *